United States Patent
Hiyama

(10) Patent No.: US 8,427,565 B2
(45) Date of Patent: Apr. 23, 2013

(54) SOLID-STATE IMAGING APPARATUS AND IMAGING SYSTEM

(75) Inventor: Hiroki Hiyama, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/465,516

(22) Filed: May 7, 2012

(65) Prior Publication Data

US 2012/0217379 A1 Aug. 30, 2012

Related U.S. Application Data

(62) Division of application No. 12/920,617, filed as application No. PCT/JP2009/054098 on Feb. 26, 2009, now Pat. No. 8,208,055.

(30) Foreign Application Priority Data

Mar. 27, 2008 (JP) ................................. 2008-084109

(51) Int. Cl.
*H04N 5/335* (2011.01)
*H04N 5/228* (2006.01)

(52) U.S. Cl.
USPC ....................................... 348/300; 348/222.1

(58) Field of Classification Search .................. 348/294, 348/300, 301, 308, 222.1; 341/155, 164, 341/166; 250/208.1
See application file for complete search history.

(56) References Cited

U.S. PATENT DOCUMENTS

| | | | |
|---|---|---|---|
| 6,188,094 B1 | 2/2001 | Kochi et al. | 257/232 |
| 6,538,591 B2 | 3/2003 | Sato et al. | 341/155 |
| 6,605,850 B1 | 8/2003 | Kochi et al. | 257/431 |
| 6,670,990 B1 | 12/2003 | Kochi et al. | 348/310 |
| 6,946,637 B2 | 9/2005 | Kochi et al. | 250/208.1 |
| 6,960,751 B2 | 11/2005 | Hiyama et al. | 250/208.1 |
| 7,110,030 B1 | 9/2006 | Kochi et al. | 348/308 |
| 7,187,052 B2 | 3/2007 | Okita et al. | 257/444 |

(Continued)

FOREIGN PATENT DOCUMENTS

| | | |
|---|---|---|
| CN | 101136177 A | 3/2008 |
| JP | 2002-232291 A | 8/2002 |
| JP | 2005-348325 A | 12/2005 |

OTHER PUBLICATIONS

H. Amemiya, "Dual-Slope Integrating Analog-to-Digital Converter with Digital Self-Calibration," Transactions on Instrumentation and Measurement, vol. IM-28, No. 1, pp. 84-86 (Mar. 1979).

(Continued)

*Primary Examiner* — Aung S Moe
(74) *Attorney, Agent, or Firm* — Fitzpatrick, Cella, Harper & Scinto

(57) ABSTRACT

A solid-state imaging apparatus includes a reference signal generating circuit for supplying, commonly to the plurality of A/D conversion circuits, at least two reference signals of which signal levels change toward different directions of electric potential, and the A/D conversion circuit includes an amplifier; an input capacitor having one terminal receiving the analog signal and the reference signal supplied from the reference signal generating circuit, and the other terminal connected to one input terminal of the amplifier; a feedback capacitor connected between the one input terminal and an output terminal of the amplifier; a comparator for comparing, with a comparing level, an output from the output terminal of the amplifier; and a connection capacitor having one terminal connected to the output terminal of the amplifier, and the other terminal connected to one input terminal of the comparator.

8 Claims, 12 Drawing Sheets

U.S. PATENT DOCUMENTS

| | | | |
|---|---|---|---|
| 7,283,305 B2 | 10/2007 | Okita et al. | 359/619 |
| 7,429,764 B2 | 9/2008 | Koizumi et al. | 257/292 |
| 7,492,400 B2 | 2/2009 | El Gamal et al. | 348/296 |
| 7,531,885 B2 | 5/2009 | Okita et al. | 257/444 |
| 7,538,804 B2 | 5/2009 | Okita et al. | 348/241 |
| 7,547,871 B2 | 6/2009 | Hiyama et al. | 250/208.1 |
| 7,557,847 B2 | 7/2009 | Okita et al. | 348/308 |
| 7,633,539 B2 * | 12/2009 | Yamashita | 348/294 |
| 7,638,826 B2 | 12/2009 | Hiyama et al. | 257/291 |
| 7,646,493 B2 | 1/2010 | Okita et al. | 356/620 |
| 7,705,897 B2 * | 4/2010 | Muramatsu | 348/294 |
| 7,755,688 B2 | 7/2010 | Hatano et al. | 348/300 |
| 7,800,563 B2 | 9/2010 | Asano et al. | 345/78 |
| 7,812,873 B2 | 10/2010 | Hiyama et al. | 348/294 |
| 7,812,876 B2 | 10/2010 | Hiyama et al. | 348/300 |
| 8,072,527 B2 * | 12/2011 | Kusuda | 348/308 |
| 8,208,055 B2 * | 6/2012 | Hiyama | 348/222.1 |
| 2005/0168363 A1 | 8/2005 | Harada | 341/118 |
| 2005/0174552 A1 | 8/2005 | Takada et al. | 355/53 |
| 2006/0290552 A1 | 12/2006 | Roh et al. | 341/155 |
| 2007/0046795 A1 * | 3/2007 | Yamashita | 348/294 |
| 2007/0080842 A1 | 4/2007 | Kawahito | 341/155 |
| 2007/0205439 A1 | 9/2007 | Okita et al. | 257/228 |
| 2008/0192127 A1 * | 8/2008 | Sakai et al. | 348/222.1 |
| 2008/0197267 A1 | 8/2008 | Mizuno et al. | 250/208.1 |
| 2008/0231491 A1 * | 9/2008 | Muramatsu et al. | 341/164 |
| 2008/0273093 A1 | 11/2008 | Okita et al. | 348/220.1 |
| 2009/0201406 A1 | 8/2009 | Okita et al. | 348/308 |
| 2009/0219429 A1 | 9/2009 | Ogura et al. | 348/308 |
| 2009/0237543 A1 | 9/2009 | Hatano et al. | 348/308 |
| 2009/0251578 A1 | 10/2009 | Yamashita | 348/302 |
| 2009/0303364 A1 | 12/2009 | Shibata et al. | 348/302 |
| 2010/0060762 A1 | 3/2010 | Takada et al. | 348/300 |
| 2010/0060763 A1 | 3/2010 | Hiyama et al. | 348/300 |
| 2010/0110257 A1 | 5/2010 | Hiyama et al. | 348/308 |
| 2010/0149394 A1 | 6/2010 | Yamazaki et al. | 348/308 |
| 2010/0238333 A1 | 9/2010 | Hatano et al. | 348/300 |
| 2010/0253821 A1 * | 10/2010 | Yamamoto | 348/294 |
| 2010/0271247 A1 | 10/2010 | Lee et al. | 341/155 |
| 2010/0295978 A1 | 11/2010 | Nakamura et al. | 348/273 |
| 2010/0314530 A1 * | 12/2010 | Hiyama et al. | 250/208.1 |
| 2011/0013046 A1 | 1/2011 | Hiyama | 348/222.1 |
| 2011/0102654 A1 | 5/2011 | Hiyama et al. | 348/300 |
| 2011/0228152 A1 | 9/2011 | Egawa | 348/300 |
| 2011/0233381 A1 | 9/2011 | Kume | 250/208.1 |
| 2012/0169896 A1 * | 7/2012 | Yamashita | 348/222.1 |

OTHER PUBLICATIONS

M. Sasaki et al., "A Wide-Dynamic-Range CMOS Image Sensor Based on Multiple Short Exposure-Time Readout With Multiple-Resolution Column-Parallel ADC," Sensors Journal, vol. 7, No. 1, pp. 151-158 (Jan. 2007).

* cited by examiner

SOLID-STATE IMAGING APPARATUS AND IMAGING SYSTEM

CROSS REFERENCE TO RELATED APPLICATION

This application is a division of U.S. application Ser. No. 12/920,617 filed on Sep. 2, 2010, the entire disclosure of which is hereby incorporated by reference herein.

TECHNICAL FIELD

The present invention relates to a solid-state imaging apparatus to be used for a scanner, a video camera, a digital still camera, and the like.

BACKGROUND ART

In recent years, a CMOS image sensor has been widely used for a digital camera, a digital camcorder, a camera unit for a portable telephone, and the like. Owing to the requirements of the reduction of the number of parts, the reduction of power consumption, and the like, a CMOS image sensor incorporating A/D conversion circuits has been researched. As a format of the CMOS image sensor, there is a format called a column A/D providing an A/D conversion circuit to each column of a pixel arrangement. Various A/D conversion formats have been proposed to be used for the column A/D, and among them integration type A/D conversion formats disclosed in Japanese Patent Application Laid-Open Publications No. 2002-232291 and No. 2005-348325 are known. If conversions are performed in two stages of higher order bits and lower order bits like the integration type A/D converter disclosed in Japanese Patent Application Laid-Open No. 2002-232291, then the conversion time becomes proportional to $2 \times 2^{N/2}$, and the method has a feature capable of shortening the conversion time in comparison with, for example, the format of comparing an input signal with a triangular wave.

The A/D conversion format disclosed in Japanese Patent Application Laid-Open No. 2005-348325 performs an A/D conversion by holding a signal from a pixel in a storage unit, followed by charging and discharging by a fixed signal. Since the A/D conversion format disclosed in Japanese Patent Application Laid-Open No. 2005-348325 also performs an A/D conversion in two stages of the higher order bits and the lower order bits, the A/D conversion format can shorten the time necessary for the A/D conversion in comparison with that of the conversion format of comparing an input signal with a triangular wave.

However, following problem occurs when the A/D converter disclosed in Japanese Patent Application Laid-Open No. 2002-232291 is used as a column A/D. If there is a discrepancy in a ratio of a changing quantity of an electric charge held in a capacitor per clock for a higher order bit conversion (unit integration quantity for the higher order bit conversion) to a changing quantity of an electric charge held in the capacitor per clock for a lower order bit conversion (unit integration quantity for the lower order bit conversion), a differential linear error is caused. For example, if 12 bits A/D conversion is performed in stages of higher order digits of 6 bits and lower order digits of 6 bits, the unit integration quantity for the higher order bit conversion is ideally required to be 64 times as large as the unit integration quantity for the lower order bit conversion, but an error is caused owing to the relative accuracy of the elements constituting the circuit and the like in the actual circuit. The relative accuracy of the elements is affected by, for example, dispersion that occurs when manufacturing the elements.

FIG. 8 cites FIG. 5 of Japanese Patent Application Laid-Open No. 2002-232291. Some of the reference numerals are deleted for simplification. The A/D converter illustrated in FIG. 8 amplifies a signal Vc1, which is a signal changing in a staircase wave, at the gain of C5/C4 for the higher order bit conversion, and on the other hand amplifies a signal Vc2, which has the same gradient as that of the signal Vc1 and the reverse polarity to that of the signal Vc1, at the gain of C6/C4 for the lower order bit conversion. The unit integration quantity for higher order bit conversion is C5/C6 times as large as the unit integration quantity for the lower order bit conversion. However, since the capacitor elements C5 and C6 are ones being different at each column, the relative accuracy of the capacitor elements C5 and C6 is different in each column. Thereby, it is conceivable that the value C5/C6 is slightly different at each column. In particular, if the column widths of a pixel arrangement are reduced in association with the reduction of pixel sizes, then the sizes of the capacitor elements able to implement within the columns, that is, capacitor values, become smaller, and consequently the relative accuracy of the capacitor elements generally become worse. If the error of the ratio of the unit integration quantity for the higher order bit conversion to the unit integration quantity for the lower order bit conversion between columns becomes nonnegligible to the required accuracy of linearity, the necessity of storing a correction coefficient into each column and executing correction operations arises. This causes the problem in which linearity correction processing becomes a very large load especially in the case where the number of conversion bits increase.

On the other hand, FIG. 9 is a citation of FIG. 6 of Japanese Patent Application Laid-Open No. 2005-348325. Reference numerals are newly added for the sake of a description. In the configuration of FIG. 9, a current based on the potential difference between a fixed voltage V_DE1 or V_DE2 and the electric potential at the inverting input terminal (−) of an operational amplifier Amp, and the magnitude of a resistance R flows through the resistance R. The electric potential at the inverting input terminal of the operational amplifier Amp ideally becomes equal to the electric potential at the non-inverting input terminal (+) thereof owing to the imaginary ground thereof. However, in an actual circuit, the two input terminals of the operational amplifier Amp have different electric potential since the characteristics of the elements constituting the operational amplifier Amp are not necessarily ideal. Therefore, the difference appears as an offset. That is, the ideal integration is not performed due to the offset caused by the elements constituting the operational amplifier Amp.

If the resolution of an A/D converter is not high, the discrepancy of the ratio from its ideal value does not affect significantly. However, if the resolution becomes higher, the discrepancy from the ideal value becomes nonnegligible, and the problem that the accurate A/D conversion results cannot be obtained is caused.

DISCLOSURE OF THE INVENTION

The solid-state imaging apparatus of the present invention provides the solid-state imaging apparatus settling the aforesaid problems and an imaging system using the solid-state imaging apparatus.

The solid-state imaging apparatus of an aspect of the present invention is a solid-state imaging apparatus comprising: a pixel region including a plurality of pixels arranged in a matrix, each pixel outputting an analog signal; a plurality of A/D conversion circuits, each arranged correspondingly to each column of the plurality of pixels for A/D converting the analog signal into a digital signal, wherein the solid-state imaging apparatus comprises a reference signal generating circuit for supplying, commonly to the plurality of A/D conversion circuits, at least two reference signals of which signal levels change toward different directions of electric potential, and the A/D conversion circuit comprises: an amplifier; an input capacitor having one terminal receiving the analog signal and the reference signal supplied from the reference signal generating circuit, and the other terminal connected to one input terminal of the amplifier; a feedback capacitor connected between the one input terminal and an output terminal of the amplifier; a comparator for comparing, with a comparing level, an output from the output terminal of the amplifier; and a connection capacitor having one terminal connected to the output terminal of the amplifier, and the other terminal connected to one input terminal of the comparator.

According to the present invention, the accuracy of the linearity of the A/D converter can be heightened, and can reduce the deterioration of the accuracy of the A/D conversion of the A/D converter owing to the influence of an offset even if the resolution of the A/D converter is heightened.

Further features of the present invention will become apparent from the following description of exemplary embodiments with reference to the attached drawings.

BEST MODE FOR CARRYING OUT THE INVENTION

First Embodiment

A solid-state imaging apparatus according to a first embodiment, to which the present invention can be applied will be described with reference to the attached drawings.

Figure 1A:
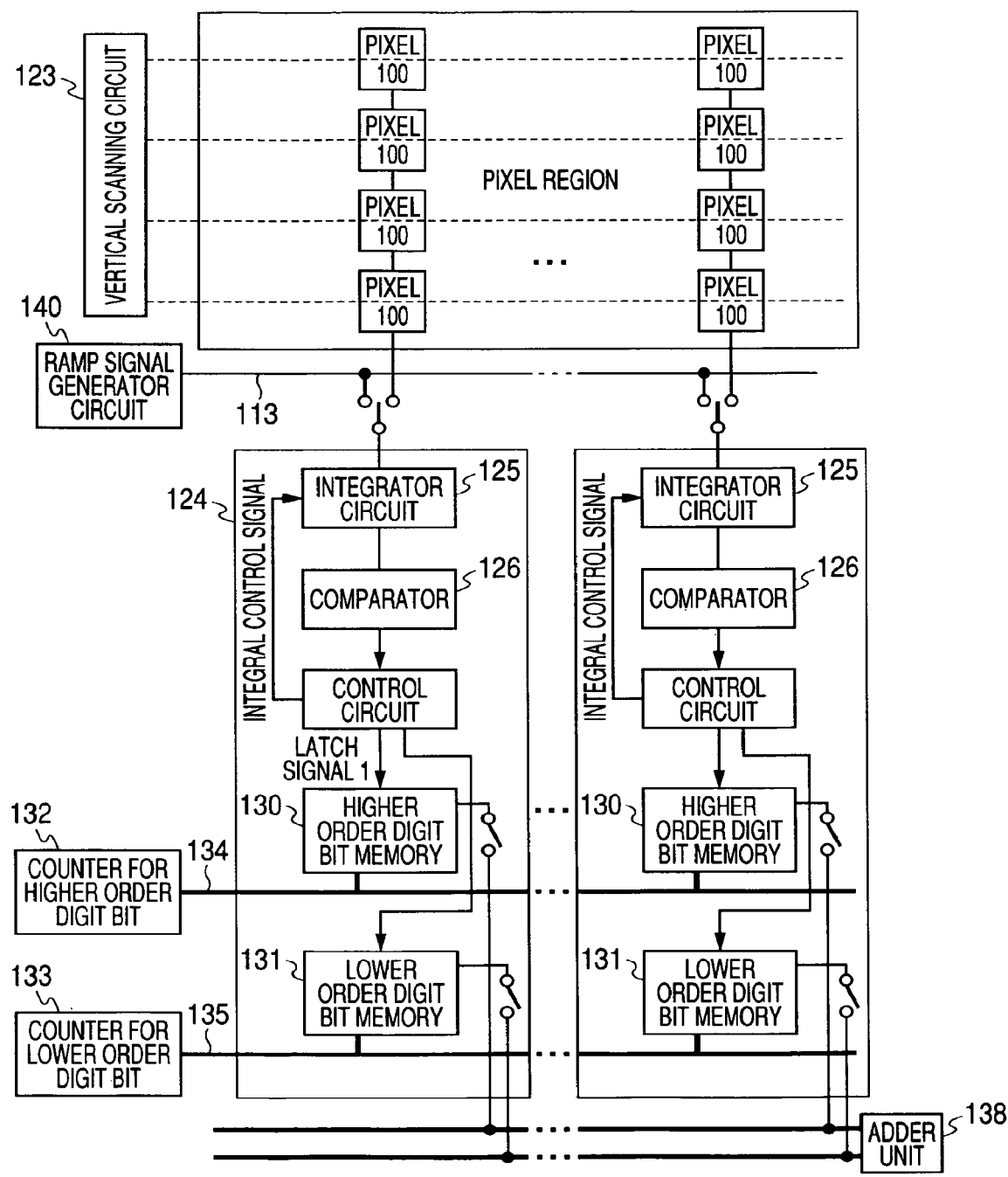
FIG. 1A is a block diagram of a solid-state imaging apparatus according to a first embodiment of the present invention.

First, the outline of the solid-state imaging apparatus according to the present embodiment is described with reference to the block diagram of FIG. 1A. The solid-state imaging apparatus 1 includes a pixel region, in which a plurality of pixels 100 are arranged in a matrix, and the pixels 100 each has the configuration illustrated by the equivalent circuit of FIG. 2. Signals output from the pixels 100 are input to column read out circuits 124 provided in respective columns as analog signals through vertical output lines 106. Each of the plurality of column read out circuits 124 includes an A/D conversion circuit including an integrator circuit 125 and a comparator 126, and memories 130 and 131 storing the A/D conversion results of higher order bits and the A/D conversion results of lower order bits, respectively. The integrator circuit 125 includes an input capacitor 108, a switch 109, an amplifier 120, a feedback capacitor 121, and a switch 110. One terminal of the input capacitor 108 receives an analog signal from a pixel and a reference signal from a reference signal generation circuit 140, which will be described later, and the other terminal of the input capacitor 108 is connected to an input terminal of the amplifier 120. The A/D conversion results stored in the higher order bit memory 130 and the lower order bit memory 131 are output to bit output lines 136 and 137, respectively, through column selection switches 114, and are output after being synthesized to an N-bit digital signal by an adder circuit 138, which is an addition unit. Although the adder circuit 138 is used here, a subtraction circuit may be used in place of the adder circuit 138 according to the polarities of the signals.

Figure 2:
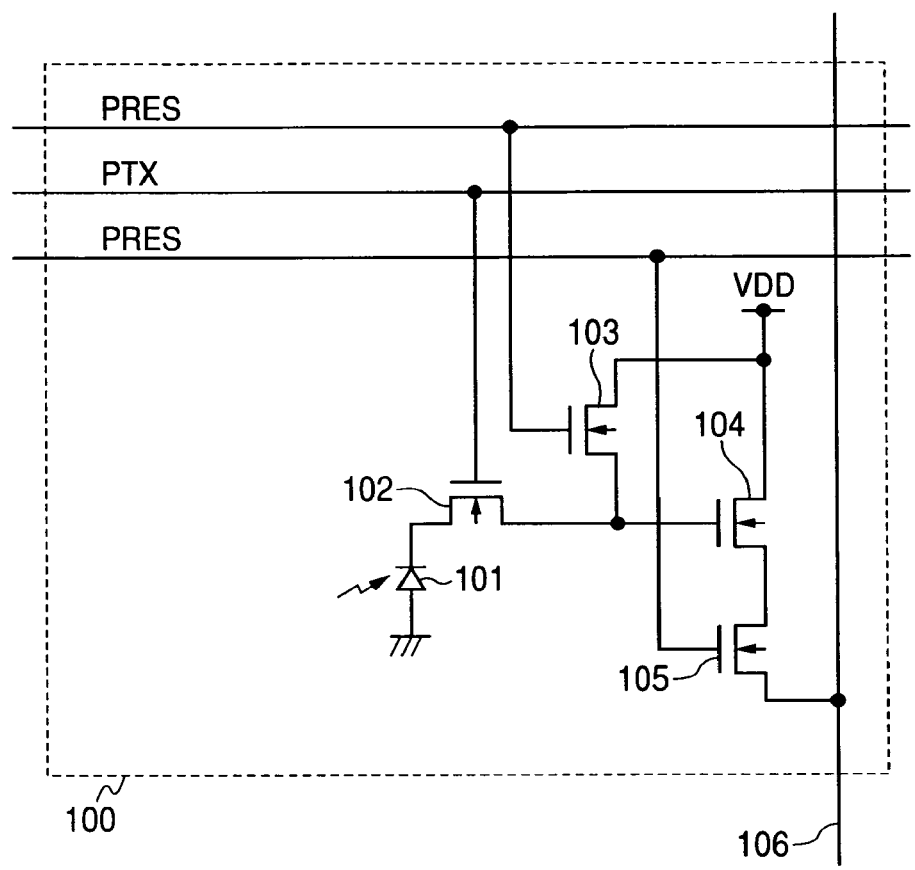
FIG. 2 is an equivalent circuit diagram of a unit pixel of the solid-state imaging apparatus according to the first and second embodiments of the present invention.

FIG. 2 shows an example of each of the pixels 100 as an equivalent circuit. A reference numeral 101 denotes a photodiode, which performs a photoelectric conversion according to an incident light to accumulate the obtained electric charge, and the cathode of the photodiode 101 is connected to a transfer MOS transistor 102. When the transfer MOS transistor 102 receives a signal PTX of a high level, then the electric charge accumulated in the photodiode 101 is transferred to the node to which the gate of an amplifying MOS transistor 104 is connected. When a selection MOS transistor 105 is changed to its conduction state by a signal PSEL, then the amplifying MOS transistor 104 forms a source follower circuit with a constant current source 107 provided to each of the vertical output lines 106. Hereby the electric potential according to the electric potential at the gate of the amplifying MOS transistor 104 appears on the vertical output line 106 as a signal. A reference numeral 103 denotes a reset MOS transistor. If the reset MOS transistor 103 is turned to its conduction state by a signal PRES, then the reset MOS transistor 103 resets the node to which the gate of the amplifying MOS transistor 104 is connected to a power source voltage VDD.

Figure 1B:
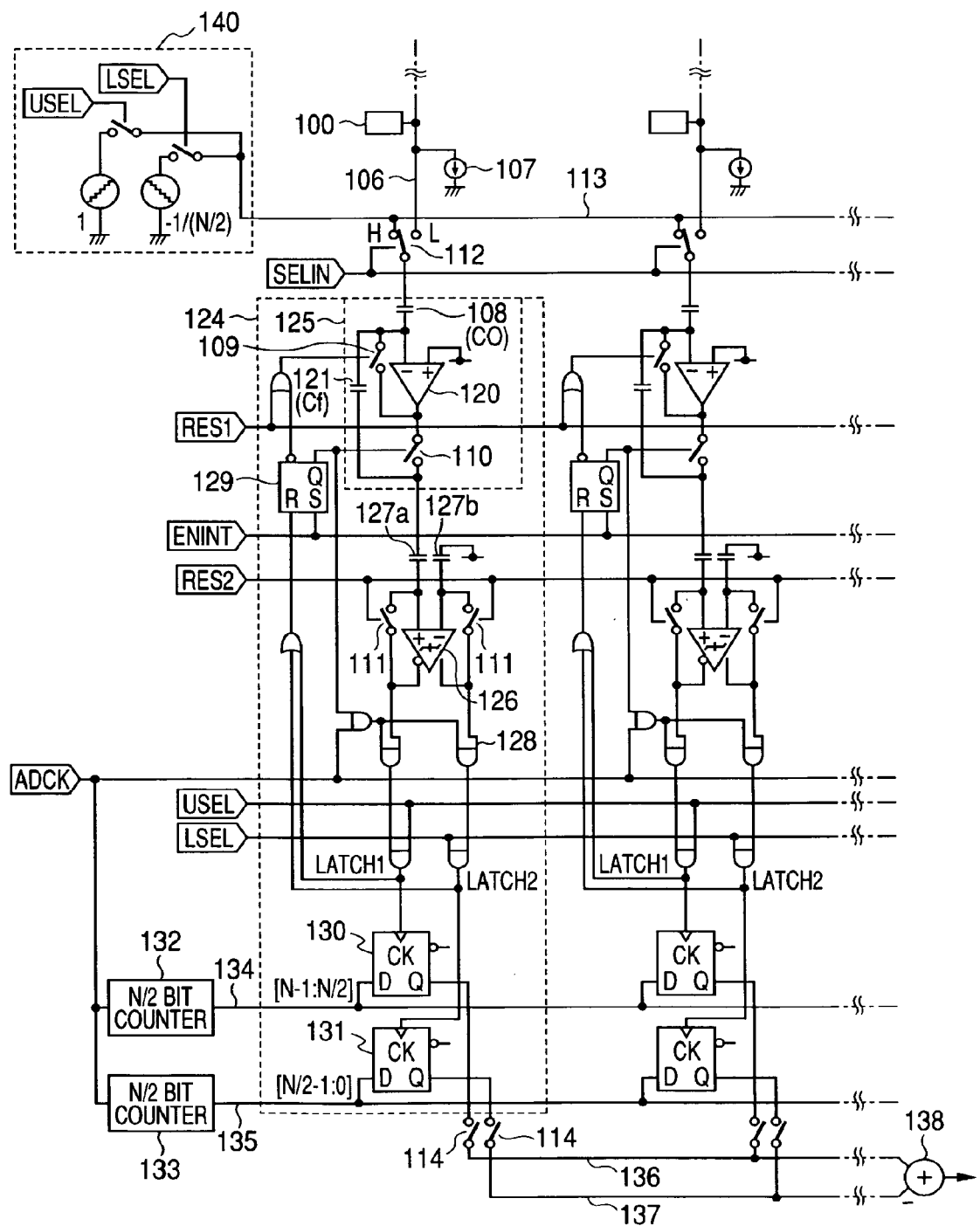
FIG. 1B is a diagram illustrating a part of the equivalent circuit of the solid-state imaging apparatus.
Figure 3A:
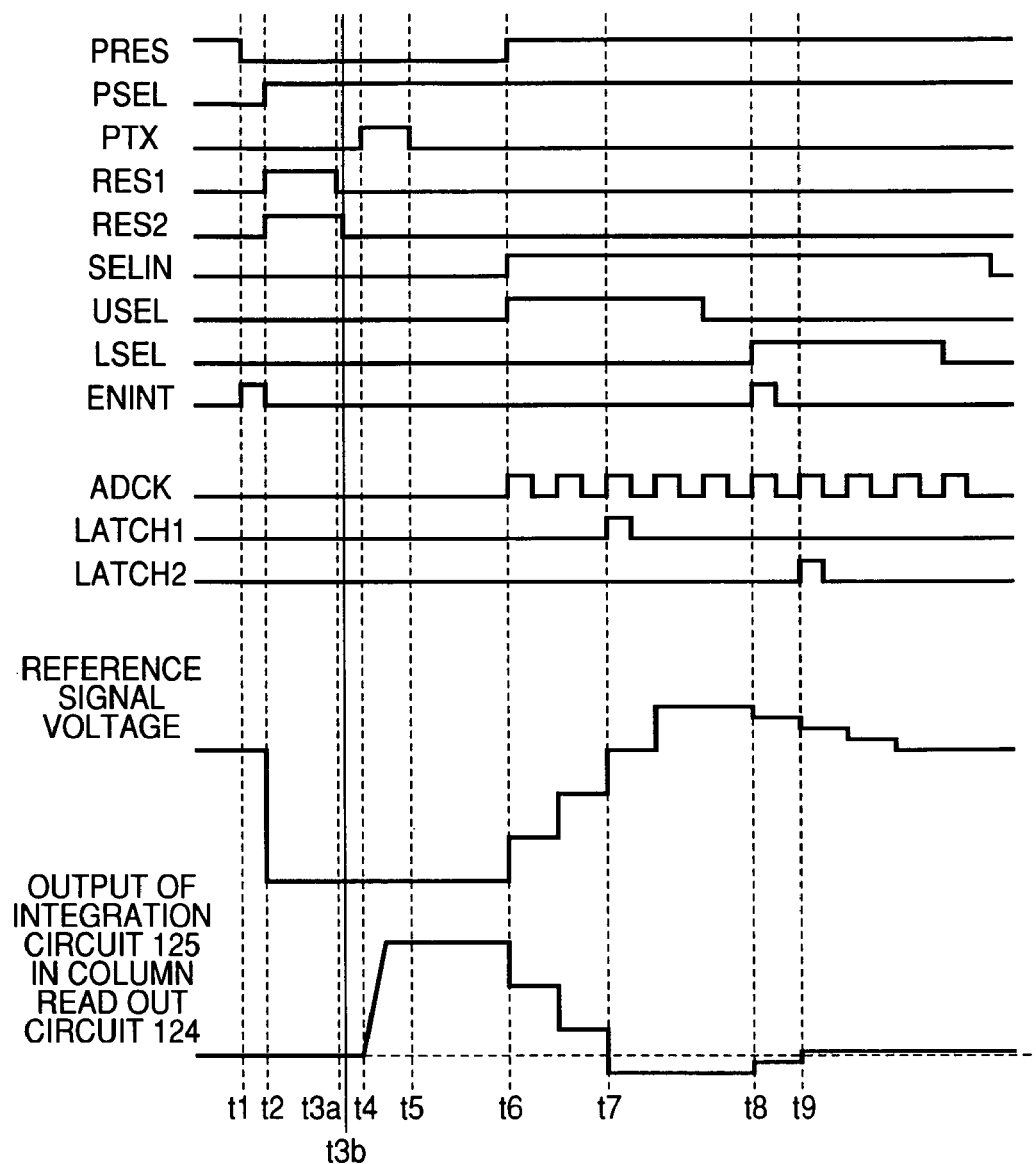
FIGS. 3A and 3B are timing charts of the solid-state imaging apparatus according to the first embodiment of the present invention.
Figure 3B:
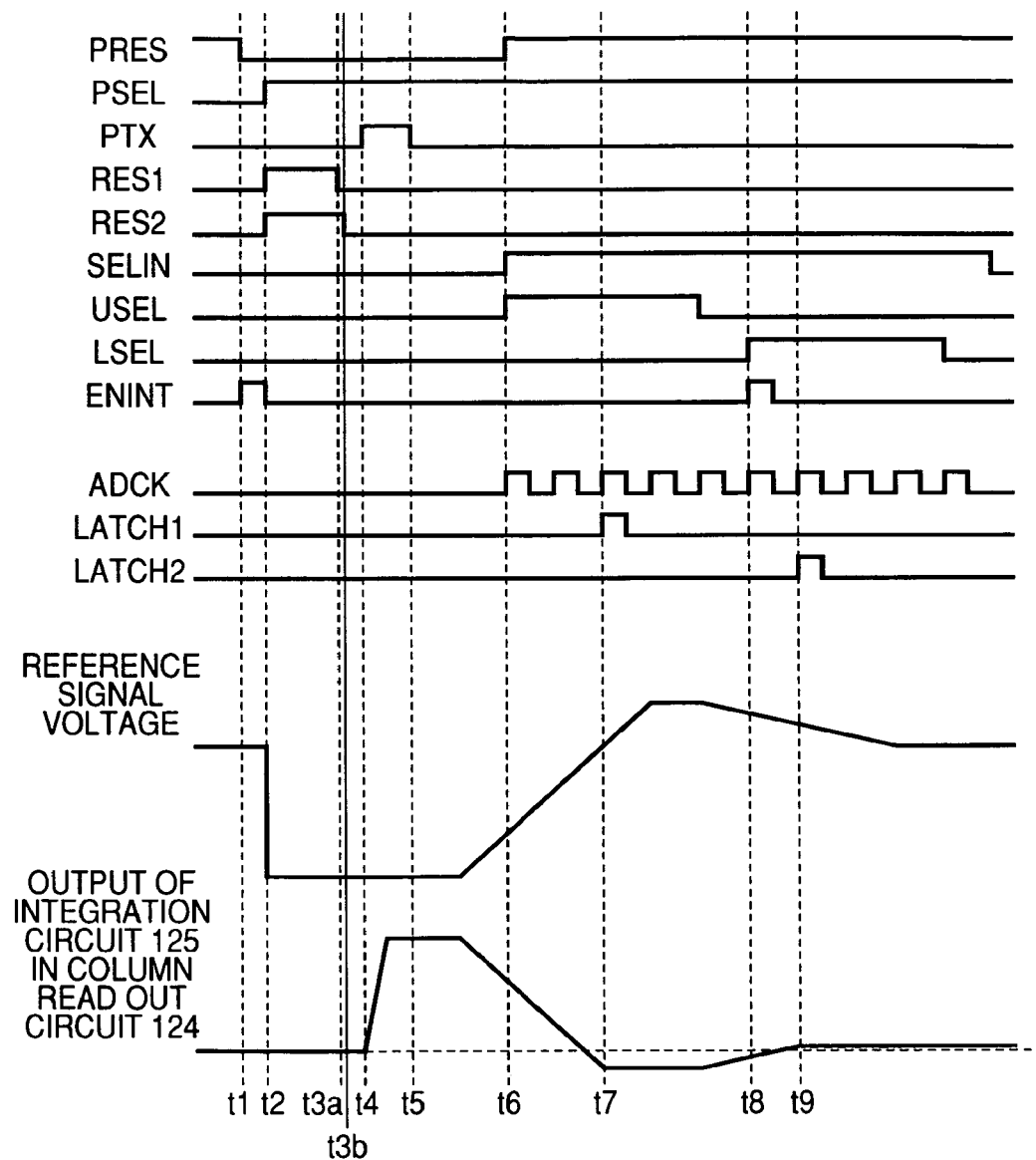

The operation of the solid-state imaging apparatus of the present embodiment is minutely described with reference to the equivalent circuit diagram of FIG. 1B and the timing chart of FIG. 3A. The reference numeral of each signal pulse corresponds to the reference numerals of each terminal in FIG. 1B or FIG. 2. Moreover, FIGS. 3A and 3B illustrate the reference signal to be supplied to a reference signal supply wiring 113 as a ramp signal voltage. Furthermore, an output of the integrator circuit 125 included in each of the column read out circuits 124 is also illustrated. Incidentally, it is supposed that the switches illustrated in FIGS. 1B and 2 are turned on by an input signal of a high level, that is, are put into their conduction states, and that the switches are turned off by an input signal of a low level, that is, are put into their non-conduction states. Moreover, concerning the selection switches 112 in FIG. 1B, the paths which are connected by the high level or low level of a pulse, are denoted by "H" or "L," respectively.

It is supposed that a predetermined exposure time has elapsed prior to a read-out operation of a pixel signal, and that an electric charge obtained by a photoelectric conversion is accumulated in the photodiode 101. Furthermore it is supposed that the input selection switches 112 are connected between the amplifying MOS transistor 104 and the vertical output lines 106. The pulses PRES, PTX, and PSEL are supplied from a vertical scanning circuit 123 to the pixels 100 in this description.

First at time t1, the pixel reset pulse PRES changes from the high level to the low level, and thereby releasing the reset state of the gate of the amplifying MOS transistor 104. At this time, the voltage just after the termination of the reset, that is, the voltage corresponding to a dark state, is held in the capacitor (hereinafter referred to as CFD) of the floating diffusion region (herein after referred to as FD region) connected to the gate electrode. Moreover, at the time t1, an integral starting signal ENIT changes to the high level, and thereby setting an RS latch 129.

Successively, at time t2, when the row selection pulse PSEL changes to the high level, the dark output corresponding to the dark time, which is held in the floating diffusion state, appears on the vertical output line 106 by the source follower circuit formed by the amplifying MOS transistor 104 and the constant current source 107. On the other hand, when a pulse RES1 is changed to the high level at the time t2, the switch 109 is turned on, and consequently the operation amplifier 120 in each of the integrator circuits 125 turns to its voltage follower state. Although the output of the operation amplifier 120 at this time includes its peculiar offset component respectively, the output becomes substantially the same as a reference voltage VC0R.

When the pulse RES1 changes from the high level to the low level at time t3a, the switch 109 changes from the on state to the off state, and the dark output on the vertical output line 106 is clamped by the input capacitor 108.

A pulse RES2 changes from the high level to the low level at time t3b immediately after the change of the pulse RES1, and a switch 111 is turned off. Then, a reset level including the component of the dark output and the offset component of the operational amplifier 120 is held in a connection capacitor 127a. Since the electric potential at the positive input terminal (+) of the comparator 126 is equal to the electric potential of the negative input terminal (−) owing to imaginary ground, it is possible to make a comparison between the signal input into the positive input terminal and a comparing level, that is, the signal that is input into the negative terminal through a connection capacitor 127b. When the difference voltage between the signal input into the positive input terminal and the signal input into the negative input terminal is positive, then the comparator 126 operates so as to output the high level from the positive output terminal and the low level from the negative output terminal. On the other hand, when the difference voltage is negative, the comparator 126 operates so as to output the high level from the negative output terminal and the low level from the positive output terminal.

Successively, a transfer pulse PTX changes to the high level over a period of from time t4 to time t5 thereby turning on the transfer MOS transistor 102, and the electric charge accumulated in the photodiode 101 is transferred to the node of the gate of the amplifying MOS transistor 104. The electric charge to be transferred is electrons in this description. If the absolute value of the transferred electric charge is denoted by Q, then the gate potential of the amplifying MOS transistor 104 lowers by Q/CFD, and the electric potential of the vertical output line 106 also changes according to the lowering of the gate potential. The electric potential of the vertical output line at this time is referred to an illuminated state output. If the gain of the source follower circuit is denoted by Gsf, then the changed amount ΔVv1 of the electric potential Vv1 of the vertical output line 106 from the dark output can be expressed by the following equation.

$$\Delta Vv1 = -(Q/CFD) \times Gsf \qquad \text{(Equation 1)}$$

The potential change of the vertical output line 106 is amplified by the inverting amplifier circuit including the operational amplifier 120, the input capacitor 108, and the feedback capacitor 121, and the signal Vs expressed by the following equation is held in the feedback capacitor 121.

$$Vs = (Q/CFD) \times Gsf \times (C0/Cf) \qquad \text{(Equation 2)}$$

C0 denotes the capacitance value of the input capacitor 108, and Cf denotes the capacitance value of the feedback capacitor 121 here. Moreover, the gain of the inverting amplifier circuit is −C0/Cf.

Figure 4:
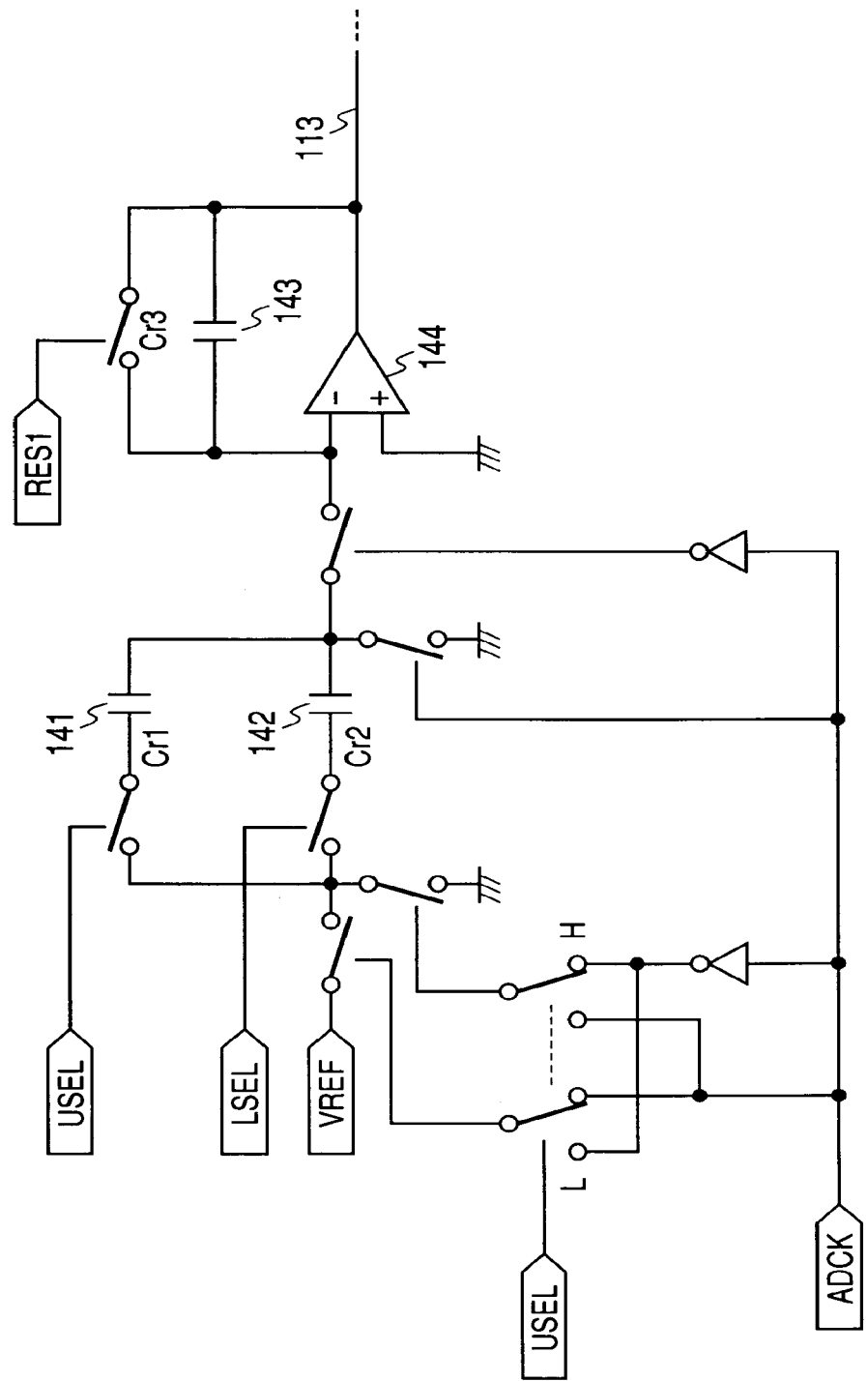
FIG. 4 is an equivalent circuit diagram of a reference signal generation circuit according to the first embodiment of the present invention.

Next at time t6, the operation enters the step of performing the A/D conversion of the signal Vs. First, the input selection switch 112 is switched to the side of the reference signal supply wiring 113. A stepwise ramp-up signal for higher order bit conversion, which is a reference signal, is supplied from the reference signal generation circuit 140 to the reference signal supply wiring 113. Although the signal having the signal level changing stepwise and monotonously in synchronization with a signal ADCK, which will be described later, is used as the ramp-up signal here, a signal having the signal level changing not stepwise but smoothly and monotonously may be used as the ramp-up signal, for example. Incidentally, the monotonously changing means that, for example, the level of the signal does not change to a lowering direction when the level rises stepwise. That is, when a signal monotonously changes, it may include a period in which the level does not change with the lapse of time. The reference signal generation circuit 140 includes switches and a capacitor integrator as illustrated in FIG. 4. Upon the conversion of a higher order bit, a pulse USEL becomes a high level, and a pulse LSEL becomes a low level, thereby generating a ramp-up signal increasing by (Cr1/Cr3)×VREF every period of the signal ADCK. On the other hand, upon the conversion of a lower order bit, the pulse LSEL becomes the high level, and the pulse USEL becomes the low level, thereby generating a ramp-down signal, which is another reference signal decreasing by (Cr2/Cr3)×VREF. That is, the directions in which the signal levels of the ramp-down signal and the ramp-up signal change are different from each other. Moreover, the electric charge of the capacitor Cr3 can be reset to be initialized by applying the high level of the pulse RES1. Although the case of inputting the same pulse as the pulse RES1 supplied to the column read out circuit 124 is illustrated here, a pulse different from the one input to the column read out circuits 124 may be input to the reference signal generation circuit 140. Although the signal having the signal level changing stepwise and monotonously in synchronization with the signal ADCK is used as the ramp-down signal here, a signal having the signal level changing not stepwise but smoothly and monotonously may be used as the ramp-up signal, for example. Incidentally, changing monotonously means that, for example, when the level rises stepwise, the level does not change to the direction of lowering. That is, a period during which the level does not change with the lapse of time may be included.

When the ramp-up signal for the conversion of high order bits is input to the integrator circuit 125 from the time t6, an integral is started. The ramp-up signal for the conversion of the higher order bits is inversely amplified at the gain of −(C0/Cf), and the output of the integrator circuit 125 consequently lowers by (C0/Cf)×(Cr1/Cr3)×VREF every clock of the signal ADCK. An output of the integrator circuit 125 is input into the positive input terminal of the comparator 126 through the connection capacitor 127a. Since the reset level sampled at time t3b is held in the connection capacitor 127a, only the changed level obtained by deducing the reset level from the output of the integrator circuit 125 is input to the comparator 126. That is, even if the elements constituting the integrator circuit 125 do not have ideal characteristics, the offset components of the integrator circuit 125 are not input to the comparator 126, and consequently an A/D conversion having high accuracy can be performed. The changed level of the signal input to the positive input terminal of the comparator 126 through the connection capacitor 127a is compared with the reference voltage input to the negative input terminal of the comparator 126 through the connection capacitor 127b. Then, a latch signal latch1 is output at time t7 when the output of the integrator circuit 125 becomes less than the reset level. The latch signal latch1 is transmitted to the higher order bit memory 130, and a counter value supplied from a counter for higher order bits 132 to the higher order bit memory 130 at that time is taken into the higher order bit memory 130. At the same time, the latch signal latch1 is also supplied to the reset terminal of the RS latch 129 to stop the integral operation of the integrator circuit 125. Supposing that the counter value at this time is CU, the output is lowered by CU×(C0/Cf)×(Cr1/Cr3)×VREF during the integral operation, and the state in which a CU×(C0/Cf)×(Cr1/Cr3)×VREF−Vs is held in the feedback capacitor 121 as the residual voltage is caused. The time at which the integral operation stops differs according to the pixel signal Vs in each column. The pulse USEL turns to the low level after the integration operations of all of the columns have ended, and the counter for the higher order bits stops.

Successively, at time t8, the pulse LSEL changes to the high level, and the pulse USEL changes to the low level, and the step of performing the A/D conversion of the lower order bits starts. A ramp-down signal for the conversion of the lower order bit has the polarity reverse to that of the ramp-up signal for performing the conversion of the higher order digital bits and the level decreasing by (Cr2/Cr3)×VREF, is supplied from the reference signal generation circuit 140 to the integrator circuit 125. The integral starting signal ENINT is input again, and the integration operation in the integrator circuit 125 is started. The ramp-down signal for the conversions of the lower order bits is inversely amplified at a gain of −(C0/Cf) and the output of the integrator circuit 125 increases by (C0/Cf)×(Cr2/Cr3)×VREF every clock of the signal ADCK. In the comparator 126, the changed level of the output of the integrator circuit 125 from the reset level held in the connection capacitor 127a is compared with the reference level input into the comparator 126 through the connection capacitor 127b. Then, at time t9 at which the output of the integrator circuit 125 becomes greater than the reference voltage, a latch signal latch2 is output. The latch signal latch2 is transmitted to the lower order bit memory 131, and a counter value supplied from a counter for lower order bits 133 to the lower order bit memory 131 at that time is taken into the lower order bit memory 131. At the same time, the latch signal latch2 is also supplied to the reset terminal of the RS latch 129 to stop the integral operation of the integrator circuit 125. The stop of the integral operation is not essential. Moreover, at this time point, the residual has become less than the unit integration quantity for the lower order bit conversion, that is, less than an integral quantity corresponding to 1 LSB.

The ratio of the unit integration quantity for higher order bit conversion to the unit integration quantity for the lower order bit conversion must be ideally $2^{N/2}$ in the case of performing the A/D conversion of N-bit data by the two stages of higher order digits of N/2 bits and lower order digit of N/2 bits. On the other hand, the ratio of the unit integration quantity for the higher order bit conversion to the unit integration quantity for the lower order bit conversion in the circuit of the present embodiment is determined by the following equation.

$$((C0/Cf) \times (Cr1/Cr3) \times VREF)/((C0/Cf) \times (Cr2/Cr3) \times VERF) = Cr1/Cr2 \quad \text{(Equation 3)}$$

That is, regardless of the values of the capacitors C0 and Cf provided in each column, the ratio is determined only by the ratio between the capacitance values of Cr1 and Cr2 in the reference signal generation circuit 140. Consequently, the errors between columns, which have conventionally been a problem, can be reduced. There is a general tendency that the relative accuracy of capacitors is improved as the sizes of the capacitor elements become larger, that is, the capacitance values becomes larger. The capacitors C0 and Cf provided in the column read out circuit 124, whose sizes are limited by a pixel pitch the capacitance values of the capacitors Cr1 and Cr2 provided in the reference signal generation circuit 140 can be easily enlarged and is advantageous in that it is able to improve the accuracy of the A/D conversion.

Moreover, if the resolution N of an A/D conversion is relatively small, it is also possible to eliminate the execution of correction by enlarging the capacitors Cr1 and Cr2. In this case, a converted N-bit digital value can be obtained by adding the A/D conversion results stored in the higher order bit memory 130 and the lower order bit memory 131 together by the adder circuit 138. If the counter circuit for lower order bits 133 is an up counter, then subtraction processing is performed. Alternatively, the counter circuit for lower order bits 133 may be configured as a down counter to perform addition (or subtraction) processing by an addition (or subtraction) circuit 138.

Moreover, a feature peculiar to the present embodiment is to also amplify the pixel signal Vs at the gain of C0/Cf by the integrator circuit 125 in the column read out circuit 124, and consequently the influences of the ratio of the C0/Cf do not appear in a result after an A/D conversion. That is, an excellent image signal having small gain errors between columns can be obtained.

Incidentally, although the counter circuits 132 and 133 are commonly used for the plurality of columns in the present embodiment, the counter circuits 132 and 133 may be independently provided to each column.

For example, if the solid-state imaging apparatus is implemented such that if the ordinary signal ADCK is supplied to the clock input of the counter circuit for higher order bits 132 at the time of a higher order bit conversion, and if a carry signal of the counter circuit for lower order bits 133 is supplied to the clock input at the time of a lower order bit conversion, then the subtraction of the residual can be performed.

Although a signal changing stepwise in synchronization with the signal ADCK is input as the reference signal in the case of FIG. 3A, the reference signal may be a signal changing with a slope as illustrated in FIG. 3B, for example.

Second Embodiment

Figure 5A:
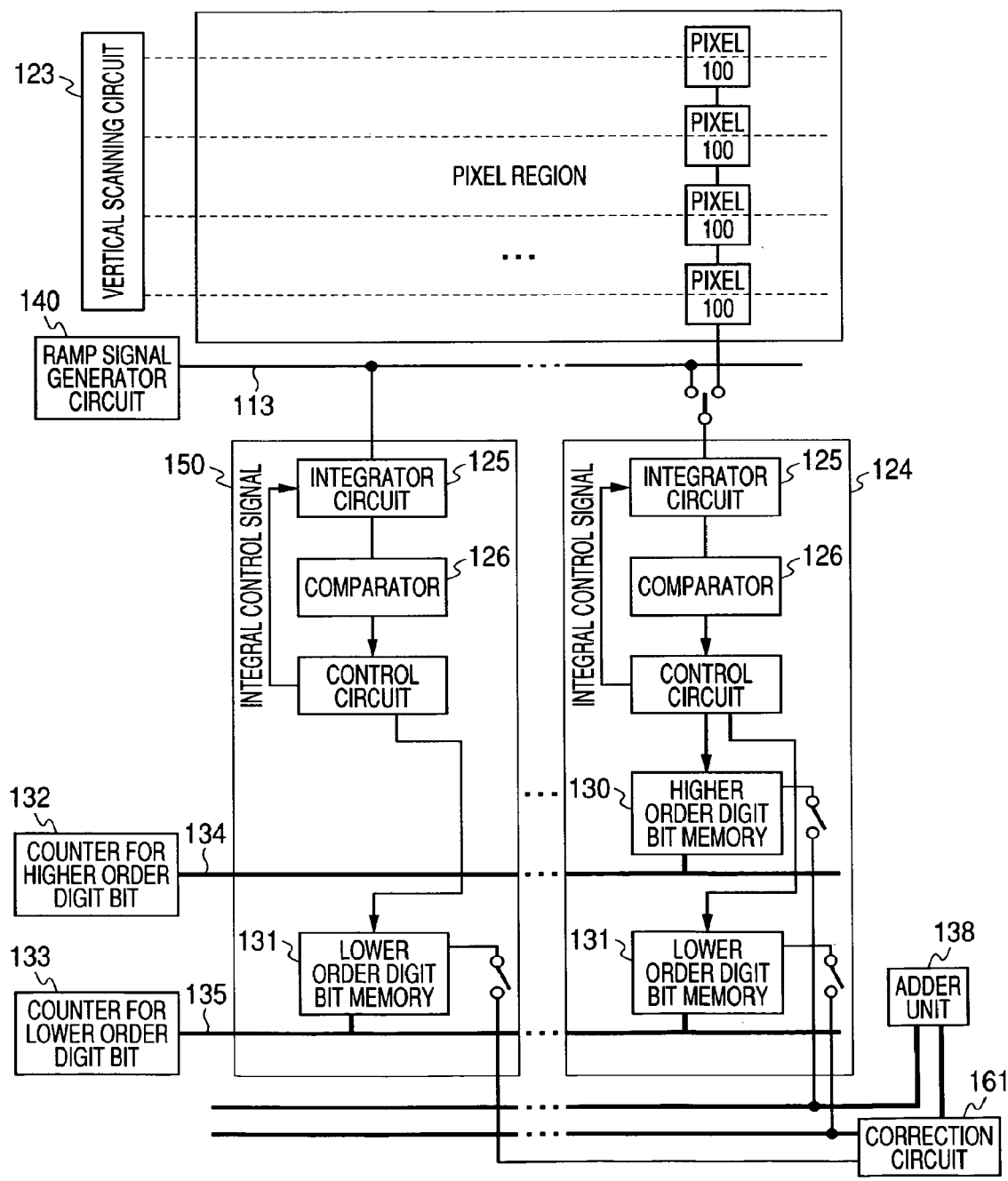
FIG. 5A is a block diagram of a solid-state imaging apparatus according to the second embodiment of the present invention.
Figure 5B:
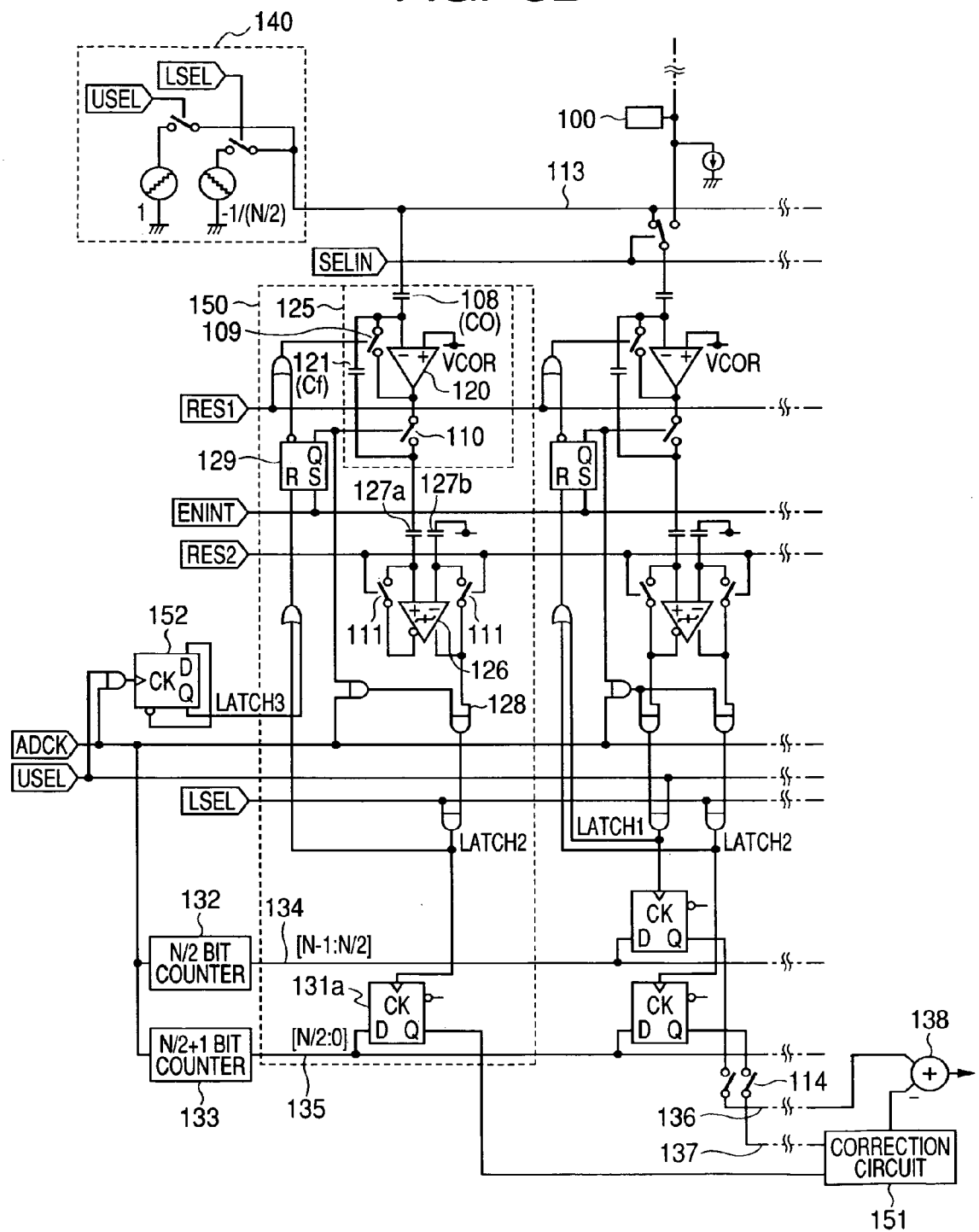
FIG. 5B is a diagram illustrating a part of the equivalent circuit of the solid-state imaging apparatus.

A solid-state imaging apparatus according to a second embodiment, to which the present invention can be applied will be described with reference to FIGS. 5A AND 5B. The solid-state imaging apparatus of the present embodiment is suitable for the column A/D format of a relatively high resolution. FIG. 5A is a block diagram illustrating the outline of the solid-state imaging apparatus, and FIG. 5B illustrates a part of the equivalent circuit of the solid-state imaging apparatus. The second embodiment differs from the first embodiment in that it further comprises a measuring circuit 150 to measure a ratio of the unit integration quantity for a higher order bit conversion time period to the unit integration quantity for a lower order bit conversion time period, which ratio is determined by the reference signal generation circuit 140, and that it further comprises a correction circuit 151 to execute correction on the basis of a measured result. Furthermore, the lower order bit memory 131a is changed from N/2 bits of the column read out circuit 124 in the first embodiment to (N/2)+1 bits, and a redundant bit is added. The measuring circuit 150 has similar configuration as that of the column read out circuit 124 to read out a pixel signal, which circuit 124 has been described with regard to the first embodiment, but the measuring circuit 150 is configured without the input selection switches 112 and to receive only a reference signal. Moreover, the measuring circuit 150 omits the higher order bit memory 130. Furthermore, the measuring circuit 150 does not include the circuit to generate the latch signal latch1, but includes a newly added one-bit counter 152 to generate a latch signal latch3. Incidentally, a description will be given here on the supposition that the configuration of a pixel is the same as that of the first embodiment.

Figure 6:
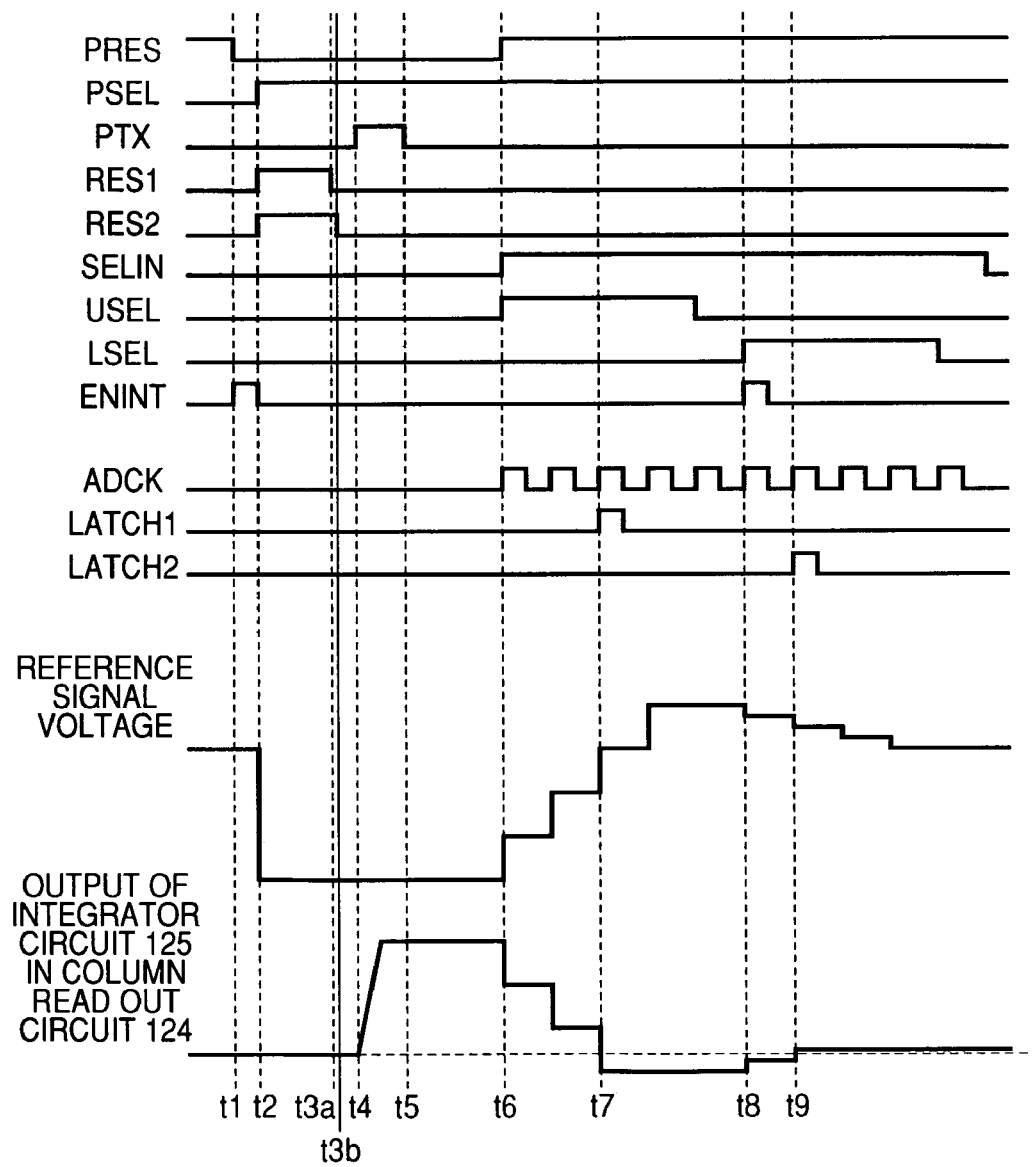
FIG. 6 is a timing char of the solid-state imaging apparatus according to the second embodiment of the present invention.

FIG. 6 illustrates an operation timing of the solid-state imaging apparatus including the measuring circuit 150. The measuring circuit 150 performs measurement in parallel with the operation of the column read out circuit 124 to read out an ordinary pixel signal in the present embodiment. In a pixel signal reading-out period of from time t1 to time t6, the measuring circuit 150 only performs the reset operation of the integrator circuit 125 based on the pulse RES1 and the sampling of the reset level by the comparator 126 based on the pulse RES2. At the time t6, a reference signal for a higher order bit conversion is input, and integral is started similarly to the column read out circuit 124, but the integral operation is stopped by the one-bit counter 152 at time t10 after one clock. Consequently, an electric charge just equal to the unit integration quantity for a higher order bit conversion is held in the feedback capacitor 121.

Successively, the unit integration quantity for a higher order bit conversion integrated in the conversion step of lower order bits, which step is started from time t8, is subjected to an A/D conversion. In preparation for the case where the unit integration quantity at a higher order bit conversion time period exceeds (N/2)×LSB, which is an ideal value, the lower order bit memory 131a is changed to be (N/2+1) bits including a redundant bit added to the N/2 bits of the lower order bit memory 131 in the column read out circuit 124.

The result of the A/D conversion is written into the lower order bit memory 131a at time t9, at which the latch signal latch2 is output, and is further input into the correction circuit 151. The result of the A/D conversion of the lower order bits from the column read out circuit 124 is input into the correction circuit 151, and the correction thereof is performed on the basis of the measured result from the measuring circuit 150. The A/D conversion result of the lower order bits after the correction is synthesized with the result of the A/D conversion of higher order bits in the adder circuit 138, and becomes an A/D conversion output, that is, a digital output.

Features peculiar to the present embodiment are described. In the present embodiment, the measuring circuit 150 measures the error of the ratio of the integral quantity for a higher order bit conversion to the integral quantity for a lower order bit conversion, which error is generated by the reference signal generation circuit 140. The correction circuit 151 corrects the A/D conversion result, thereby making it possible to obtain an A/D conversion output having higher linearity accuracy.

Moreover, in the solid-state imaging apparatus of the present embodiment, the period in which the column read out circuit 124 performs the A/D conversion and the measuring period in which the measuring circuit 150 performs the measurement overlap each other. Consequently, for example, if the ratio of the unit integration quantity at the higher order bit conversion to the unit integration quantity for the lower order bit conversion changes dependently on temperature, then the influences appearing dependently on temperature can be sequentially corrected. Consequently, the A/D conversion can be performed stably with high accuracy to the changes of environment. Incidentally, the measurement of the ratio of the integral quantity for the higher order bit conversion to the integral quantity for the lower order bit conversion can of course be executed immediately after power activation or in the early stage of the start of photographing, and the ratio may be measured by lengthening the integral time by 2 clocks or more.

Incidentally, although the correction of the digital signal from the column read out circuit 124 is performed in the present embodiment, it is also possible to perform the correction of the reference signal generation circuit 140. For example, in a reference signal generation circuit 140 configured as illustrated in FIG. 4, by implementing a capacitor array capable of finely adjusting the value of the capacitor Cr2 or Cr1, and controlling the connection thereof, the ratio of the unit integration quantity for the higher order bit conversion to the unit integration quantity for the lower order bit conversion may be corrected.

Moreover, the connection capacitor 127b is connected to the negative input terminal of the comparator 126 in the configuration examples illustrated in FIGS. 1B and 5. This connection capacitor 127b has a capacitance value equal to that of the connection capacitor 127a and is provided for adjusting the symmetry between the negative input terminal and the positive input terminal. Consequently, if the symmetry is not significantly required, the connection capacitor 127b may be omitted.

Although the reference signal changing stepwise has been exemplified to be described in this embodiment, the reference signal may be the one changing with a slope similarly to the first embodiment.

Third Embodiment

Figure 7:
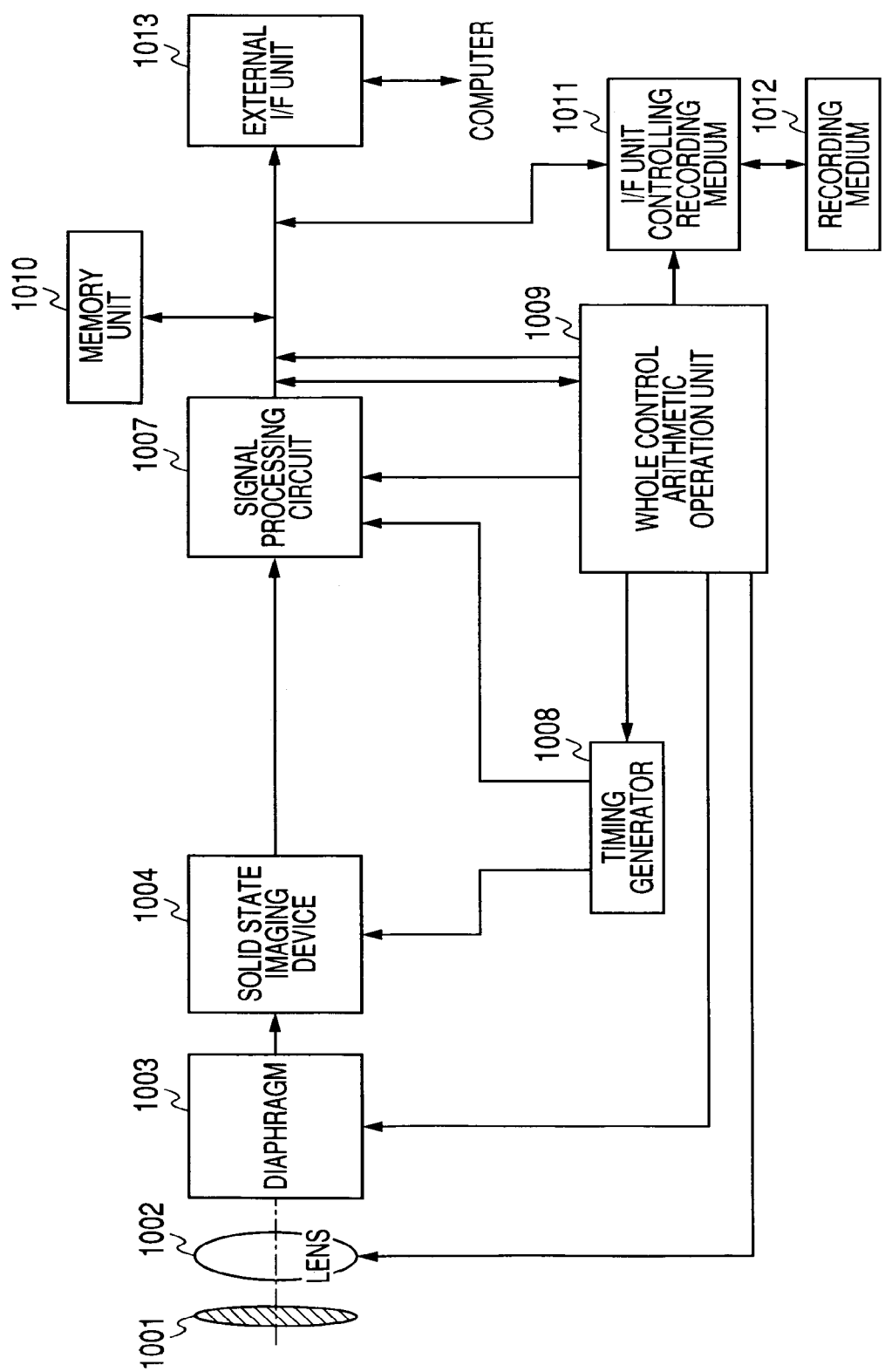
FIG. 7 is a diagram illustrating a configuration example of an imaging system according to a third embodiment.
Figure 8:
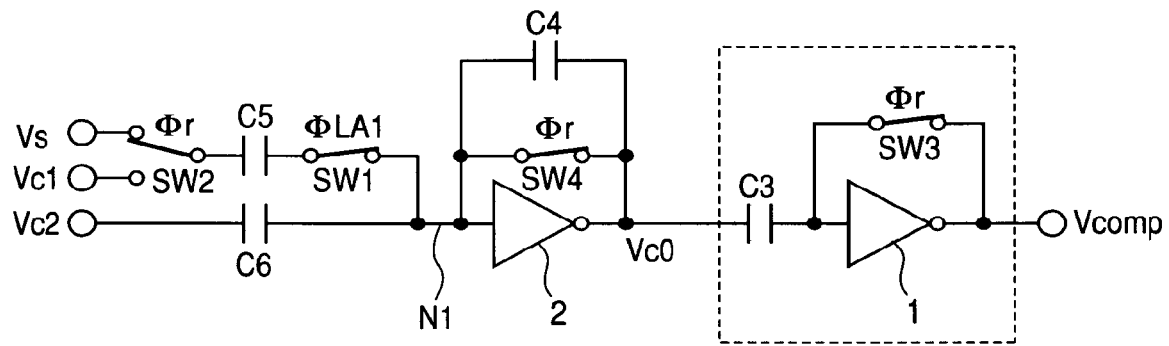
FIG. 8 is a circuit diagram illustrating an A/D conversion unit according to Japanese Patent Application Laid-Open No. 2002-232291.
Figure 9:
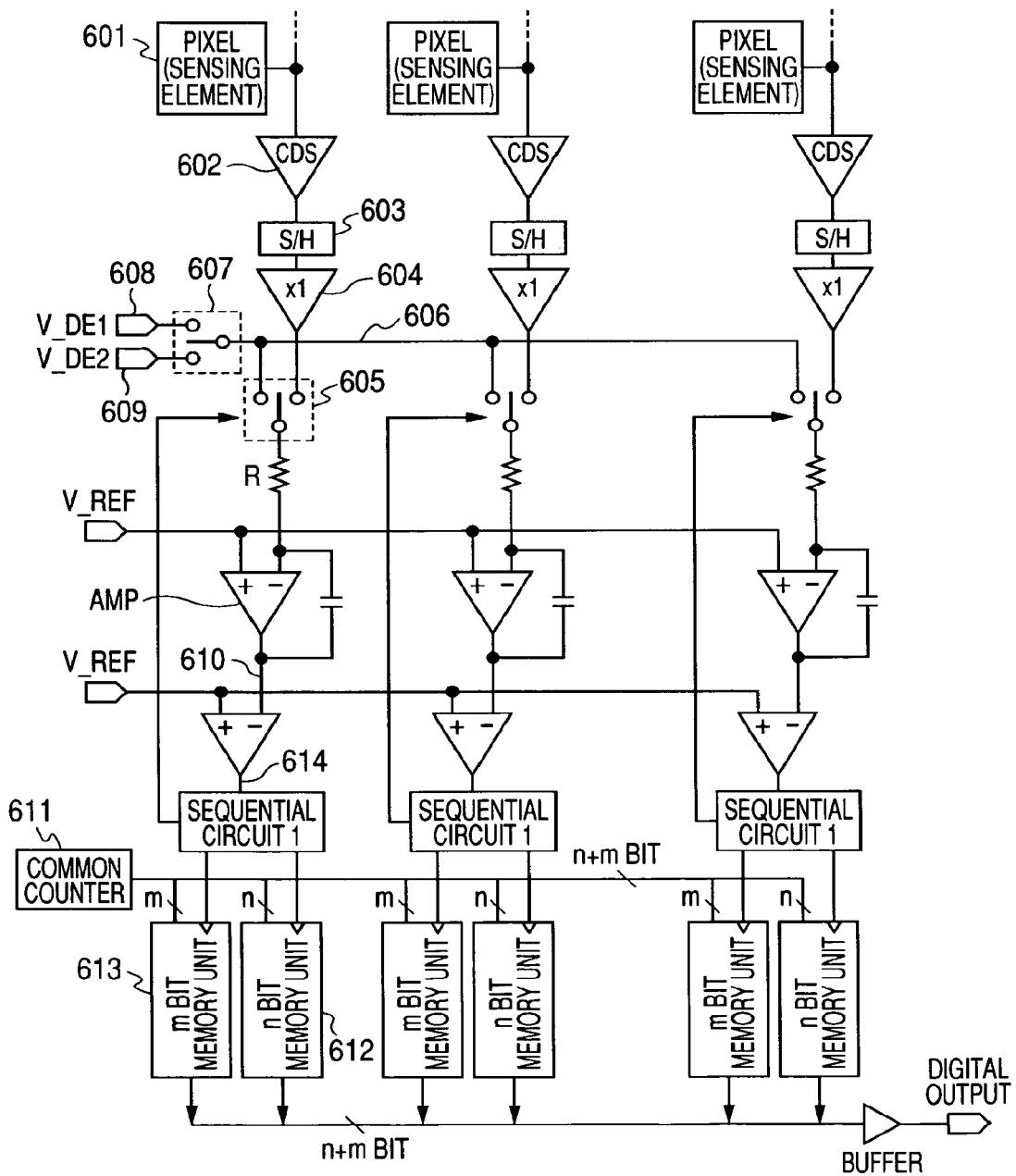
FIG. 9 is a diagram citing FIG. 6 of Japanese Patent Application Laid-Open No. 2005-348325.

FIG. 7 is a diagram illustrating the configuration of an imaging system 1000 using the solid-state imaging apparatus of each of the aforesaid embodiments, to which the present invention is applied. 1001 denotes a barrier used as a protection of a lens and the barrier also serves as a main switch, and 1002 denotes a lens, which is an optical system for providing an optical image of a subject on a solid-state imaging apparatus 1004. The quantity of the light passing through the lens 1002 can be changed by a diaphragm 1003. The solid-state imaging apparatus 1004 (corresponding to the solid-state imaging apparatus described in each of the aforesaid embodiments) convert the optical image formed by the lens 1002 into image data. A signal processing unit 1007 performs various corrections of the image data output from the solid-state imaging apparatus 1004 and the compression of the data. A timing generator 1008 outputs various timing signals to the signal processing unit 1007. Incidentally, each of the circuits 1007 and 1008 may be formed on the same chip as that of the solid-state imaging apparatus 1004. The imaging system 1000 includes a whole control arithmetic operation unit 1009 for controlling various operations and the whole of the imaging system 1000, a memory unit 1010 for storing image data temporarily, and an interface unit controlling recording medium 1011 for performing the recording or reading out of a recording medium. Furthermore, the imaging system 1000 includes a recording medium 1012 for performing the recording or reading out of image data, against which a semiconductor memory and the like can be attached and detached, and an external interface (I/F) unit 1013 for performing the communication with an external computer and the like.

Next, the operation of the imaging system 1000 illustrated in FIG. 7 is described. When the barrier 1001 is opened, the main power source is turned on, and then the power source of the control system, such as the whole control arithmetic operation unit 1009, is next turned on. Furthermore, the power source of the photographing system circuit, such as the solid-state imaging apparatus 1004, is successively turned on.

Next, the operation of controlling the exposure quantity is performed. The whole control arithmetic operation unit 1009 opens the diaphragm 1003, and the signal output from the solid-state imaging apparatus 1004 at this time is input into the signal processing unit 1007. The signal processing unit 1007 makes the whole control arithmetic operation unit 1009 perform the operation for obtaining an exposure on the basis of the signal. The brightness of the subject is determined on the basis of the result of the operation, and the whole control arithmetic operation unit 1009 controls the diaphragm. The determination can be performed by, for example, the comparison of the operation result with the data stored in the whole control arithmetic operation unit 1009 in advance.

Next, the whole control arithmetic operation unit 1009 extracts high frequency components to perform the operation of obtaining the distance from the imaging system 1000 to the subject on the basis of the signal output from the solid-state imaging apparatus 1004. After that, the whole control arithmetic operation unit 1009 drives the lens 1002, and determines whether the lens 1002 is in-focus in that state or not. When the whole control arithmetic operation unit 1009 determines that the lens 1002 is not in-focus, then the whole control arithmetic operation unit 1009 drives the lens 1002 again to perform distance measurement. The determination can be performed by, for example, the comparison of data stored in the whole control arithmetic operation unit 1009 in advance.

Then, a main exposure starts after the determination of being in-focus. When the exposure ends, the image signal output from the solid-state imaging apparatus 1004 is processed by the signal processing unit 1007, and then is held in the memory unit 1010 by the whole control arithmetic operation unit 1009. After that, the data held in the memory unit 1010 is recorded in the detachable recording medium 1012, such as the semiconductor memory, through the I/F unit controlling a recording medium 1011 by the control of the whole control arithmetic operation unit 1009. Moreover, the data may be input to a computer or the like directly through the external I/F unit 1013.

The embodiments described above are all illustrative ones, and the concrete configurations of the embodiments may be changed without departing from the sprit and scope of the present invention.

Others

The reference signal generation circuit 140 described in the above-mentioned embodiments is not limited to the one having the configuration illustrated in FIG. 4. The circuit can be arbitrarily configured as long as it can supply at least two reference signals having the signal levels changing into directions different from each other. That is, a circuit generating three or more different reference signals may be adopted.

Moreover, the following case is considered. That is, the resolution of the A/D conversion circuit is N-bits; the higher order digits of m-bits of the N-bits are subjected to the A/D conversion on the basis of one reference signal; and the lower order digits of n-bits of N-bits are subjected to an A/D conversion operation on the basis of another reference signal. Here, N=m+n. The changing quantity of the reference signal per unit time period of the reference signal to be used for the A/D conversion of the lower order digits of n-bits to the changing quantity per unit time period, that is, per step, of the reference signal to be used for the A/D conversion of the higher order digits of m-bits at this time reference signal is ½".

Moreover, although only the configuration in which one reference signal generation circuit commonly supplies the reference signal to all of the A/D converters in the aforesaid embodiments is illustrated, a plurality of reference signal generation circuits may be provided, for example, and the respective reference signal generation circuits may supply reference signals to a plurality of different A/D converters. To put it more concretely, it is conceivable to implement different reference signal generation circuits to be connected to the odd columns and even columns of pixels, or to implement different reference signal generation circuits to be connected to the left and right sides of pixel regions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-084109, filed Mar. 27, 2008, which is hereby incorporated by reference herein in its entirety.

The invention claimed is:

1. A driving method of a solid-state imaging apparatus including a pixel region that includes a plurality of pixels arranged in a matrix of columns; and a plurality of A/D conversion circuits for A/D conversion, with one of the A/D conversion circuits arranged to corresponding to each column of pixels, and each of the A/D conversion circuits including an integrator circuit having an input capacitor, the driving method comprising steps of:

outputting an analog signal from a pixel to the input capacitor to integrate a signal based on the analog signal, according to a first operation, which is one of a charging operation and a discharging operation of the integrator circuit;

conducting a second operation, which is the other of the charging operation and the discharging operation of the integrator circuit in the first operation, according to a first signal supplied to the input capacitor;

comparing an output signal from the integrator circuit with a comparing level signal, after conducting the second operation;

conducting the first operation according to a second signal, which is supplied to the input capacitor and which has a signal level that changes in a direction opposite to a direction of change of a signal level of the first signal; and comparing the output signal from the integrator circuit with the comparing level signal, after conducting the first operation according to the second signal.

2. The driving method according to claim 1, wherein each of the A/D conversion circuits has a resolution of N-bits, where N=m+n, and each of the A/D conversion circuits performs an A/D conversion of a higher order bit of m-bits based on the first signal, and performs an A/D conversion of a lower order bit of m-bits based on the second signal.

3. The driving method according to claim 1, wherein each of the integrator circuits includes an amplifier and a feedback capacitor connected between an input terminal and an output terminal of the amplifier, and wherein the feedback capacitor performs the charging operation and the discharging operation of the integrator circuit.

4. A solid-state imaging apparatus comprising:
a pixel region that includes a plurality of pixels arranged in a matrix of columns, each pixel outputting an analog signal;
a plurality of A/D conversion circuits, with one of the A/D conversion circuits arranged to correspond to each column of pixels, for A/D converting the analog signal into a digital signal; and
a reference signal generating circuit for supplying, commonly to the plurality of A/D conversion circuits, a first reference signal whose electric potential changes at a first changing rate with respect to time, and a second reference signal whose electric potential changes in a direction different from the first reference signal, at a second changing rate with respect to time, the second changing rate is smaller than the first changing rate,
wherein each of the A/D conversion circuits includes:
an integrator circuit;
an input capacitor for receiving the analog signal, the first reference signal, and the second reference signal, and for outputting signals based on the analog signal, the first reference signal, and the second reference signal; and
a comparator for comparing an output from the integrator circuit with a comparing level.

5. The solid-state imaging apparatus according to claim 4, wherein for each of the A/D conversion circuits, the integrator circuit performs an integration based on the analog signal outputted from a pixel to the input capacitor, according to a first operation, which is one of a charging operation and a discharging operation of the integrator circuit and, after the integration, outputs a first integration signal derived based on the first reference signal supplied to the input capacitor, according to a second operation, which is the other of the charging operation and the discharging operation of the integrator circuit, or outputs a second integration signal derived based on the second reference signal supplied to the input capacitor and to the integrator circuit, according to the first operation, and
wherein the comparator compares the first integration signal and a comparing level, and compares the second integration signal and the comparing level.

6. The solid-state imaging apparatus according to claim 5, wherein each integrator circuit includes an amplifier and a feedback capacitor connected between an input terminal and an output terminal of the amplifier, and wherein the feedback capacitor performs the charging operation and the discharging operation of the integrator circuit.

7. The solid-state imaging apparatus according to claim 6, wherein
each of the A/D conversion circuits further comprise an input selecting element, and
the input capacitor includes one terminal connected to the input selecting element and another terminal connected to the input terminal of the amplifier, wherein
the input selecting element is configured to select supplying the analog signal to the input capacitor or supplying the first reference signal and the second reference signal to the input capacitor.

8. The solid-state imaging apparatus according to claim 7, wherein
the input selecting elements of the plurality of the A/D conversion circuits are commonly connected to the reference signal generating circuit.

* * * * *